US012228832B2

(12) United States Patent
Shen et al.

(10) Patent No.: US 12,228,832 B2
(45) Date of Patent: Feb. 18, 2025

(54) DISPLAY PANEL AND DISPLAY DEVICE

(71) Applicants: Beijing BOE Display Technology Co., Ltd., Beijing (CN); BOE Technology Group Co., Ltd., Beijing (CN)

(72) Inventors: Lijiao Shen, Beijing (CN); Yu Ma, Beijing (CN); Xiaona Liu, Beijing (CN); Jiliang Zhang, Beijing (CN); Zhitao Li, Beijing (CN); Linwei Li, Beijing (CN); Xiaofeng Yin, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/272,362

(22) PCT Filed: Nov. 30, 2021

(86) PCT No.: PCT/CN2021/134579
§ 371 (c)(1),
(2) Date: Jul. 14, 2023

(87) PCT Pub. No.: WO2023/097498
PCT Pub. Date: Jun. 8, 2023

(65) Prior Publication Data
US 2024/0310685 A1    Sep. 19, 2024

(51) Int. Cl.
*G02F 1/1362*    (2006.01)
*H01L 27/12*    (2006.01)

(52) U.S. Cl.
CPC .. *G02F 1/136286* (2013.01); *G02F 1/136209* (2013.01); *H01L 27/124* (2013.01)

(58) Field of Classification Search
CPC ..................................................... G02F 1/1362
See application file for complete search history.

(56) References Cited

U.S. PATENT DOCUMENTS

| 2012/0268813 | A1 | 10/2012 | Kim et al. |
| 2016/0313621 | A1 | 10/2016 | Zhou |
| 2018/0373104 | A1 | 12/2018 | Qin et al. |

FOREIGN PATENT DOCUMENTS

| CN | 102749802 A | 10/2012 |
| CN | 103454798 A | 12/2013 |
| CN | 206162458 U | 5/2017 |

(Continued)

*Primary Examiner* — Sang V Nguyen
(74) *Attorney, Agent, or Firm* — IPro, PLLC (57) ABSTRACT

Provided is a display panel, including: a substrate, a plurality of sub-pixels, a plurality of data lines, and a black matrix; wherein each the sub-pixel is divided into at least two domains along a column direction of the array; and the data line deviates from the column direction of the array and bends toward the row direction of the array to form a corner, wherein a distance between an outer edge of an orthographic projection of the black matrix covering the corner onto the substrate and an outer edge of an orthographic projection of the corner onto the substrate is greater than a distance between an edge of an orthographic projection of the black matrix covering rest of the data line onto the substrate and a corresponding edge of an orthographic projection of the data line covered by the black matrix onto the substrate.

18 Claims, 7 Drawing Sheets

(56) References Cited

FOREIGN PATENT DOCUMENTS

| | | | | | |
|---|---|---|---|---|---|
| CN | 107479766 | A | 12/2017 | | |
| CN | 107741675 | A | 2/2018 | | |
| CN | 107861303 | A | 3/2018 | | |
| CN | 108646451 | A | 10/2018 | | |
| CN | 109117025 | A | 1/2019 | | |
| CN | 106249493 | B | 10/2019 | | |
| CN | 111736387 | * | 10/2020 | ........... | G02F 1/1362 |
| CN | 111736387 | A | 10/2020 | | |
| KR | 20160083340 | * | 7/2016 | ........... | G02F 1/1362 |
| KR | 20160083340 | A | 7/2016 | | |

* cited by examiner

DISPLAY PANEL AND DISPLAY DEVICE

This application is a U.S. national stage of international application No. PCT/CN2021/134579, filed on Nov. 30, 2021, and entitled "DISPLAY PANEL AND DISPLAY DEVICE", the disclosures of which is herein incorporated by reference in its entirety.

TECHNICAL FIELD

The embodiments of the present disclosure relate to the technical field of display, and in particular to a display panel and a display device.

BACKGROUND

Contrast is one of the important indicators to measure the performance of liquid crystal display products, especially for high-contrast portable display products (e.g. hand-held Pad panels). For ensuring high contrast, it is critical to prevent the issue of gray level 0 (L0) light leakage.

SUMMARY

The embodiments of the present disclosure provide a display panel and a display device.

Some embodiments of the present disclosure provide a display panel, including a substrate;
  a plurality of sub-pixels disposed in an array on the substrate;
  a plurality of data lines disposed on the substrate; and
  a black matrix disposed on a side, distal to the substrate, of the data lines, wherein an orthographic projection of the black matrix onto the substrate covers the data lines; wherein
  the plurality of data lines and the plurality of sub-pixels are alternately arranged in sequence along a row direction of the array, and each data line is connected to one column of the sub-pixels corresponding to the data line;
  each of the sub-pixels is divided into at least two domains along a column direction of the array; and
  at a domain boundary position of two adjacent domains, the data line deviates from the column direction of the array and bends toward the row direction of the array to form a corner,
  wherein, a distance between an outer edge of an orthographic projection of the black matrix covering the corner onto the substrate and an outer edge of an orthographic projection of the corner onto the substrate is greater than a distance between an edge of an orthographic projection of the black matrix covering the rest of the data line onto the substrate and a corresponding edge of an orthographic projection of the data line covered by the black matrix onto the substrate; and
  the outer edge corresponds to an edge where a raised side of the corner is located.

In some embodiments, a width of the orthographic projection of the black matrix covering the corner onto the substrate is greater than or equal to a width of the orthographic projection of the black matrix covering the rest of the data line onto the substrate.

In some embodiments, at the outer edge of the orthographic projection of the corner onto the substrate, a distance between a straight line, where a vertex of the corner is located, along the column direction of the array and a straight line, where a bending point forming the corner is located, along the column direction of the array ranges from 1 to 3 μm.

In some embodiments, the black matrix covering the corner forms a same shape as the corner;
  a vertex of a corner of the black matrix and a vertex of the corner of the data line are disposed on a same straight line along the row direction of the array; and
  a distance between the vertex of the corner of the black matrix and the vertex of the corner of the data line ranges from 2 to 4 μm.

In some embodiments, the outer edge of the orthographic projection of the black matrix covering the corner onto the substrate is parallel to the outer edge of the orthographic projection of the corner onto the substrate; and
  the distance between the outer edge of the orthographic projection of the black matrix covering the corner onto the substrate and the outer edge of the orthographic projection of the corner onto the substrate ranges from 2 to 4 μm.

In some embodiments, the distance between the edge of the orthographic projection of the black matrix covering the rest of the data line onto the substrate and the corresponding edge of the orthographic projection of the data line covered by the black matrix onto the substrate ranges from 1 to 2 μm.

In some embodiments, a shape of the corner of the black matrix and a shape of the corner of the data line are both triangular;
  at an outer edge of an orthographic projection of the corner of the black matrix onto the substrate, a first bending start point and a first bending end point forming the corner of the black matrix are disposed on a same straight line along the column direction of the array;
  at an outer edge of an orthographic projection of the corner of the data line onto the substrate, a second bending start point and a second bending end point forming the corner of the data line are disposed on a same straight line along the column direction of the array; and
  a difference between a distance between the first bending start point and the first bending end point and a distance between the second bending start point and the second bending end point ranges from 3 to 5 μm.

In some embodiments, at the outer edge of the orthographic projection of the corner onto the substrate, a distance between a straight line, where a vertex of the corner is located, along the column direction of the array and a straight line, where a bending point forming the corner is located, along the column direction of the array is 0.

In some embodiments, the data lines corresponding to two adjacent domains of the sub-pixels respectively deviate from the column direction of the array toward the domain boundary position, and intersect at the domain boundary position to form a vertex of the data line;
  the black matrix covering the data line has a same shape as the data line;
  a vertex of the black matrix and the vertex of the data line are disposed on a same straight line along the row direction of the array; and
  a distance between the vertex of the black matrix and the vertex of the data line ranges from 1 to 4 μm.

In some embodiments, an outer edge of an orthographic projection of the black matrix covering the data line onto the substrate is parallel to an outer edge of an orthographic projection of the data line onto the substrate;

a distance between the outer edge of the orthographic projection of the black matrix covering the data line onto the substrate and the outer edge of the orthographic projection of the data line onto the substrate ranges from 1 to 4 μm; and the outer edge corresponds to an edge where the vertex of the data line is located.

In some embodiments, portions, except the domain boundary position, of the data lines corresponding to two adjacent domains of the sub-pixels deviate from the column direction of the array toward the domain boundary position.

In some embodiments, the sub-pixel includes a pixel electrode and a common electrode, one of the pixel electrode and the common electrode is disposed on a side, proximal to the substrate, of the data line, and another is disposed on a side, distal to the substrate, of the data line and disposed on a side, proximal to the substrate, of the black matrix;

an orthographic projection of the pixel electrode onto the substrate is overlapped with an orthographic projection of the common electrode onto the substrate;

one of the pixel electrode and the common electrode, which disposed on the side, distal to the substrate, of the data line is a slit electrode; and a shape of a slit in the slit electrode is same as a shape of the data line with the corner corresponding to the sub-pixel.

In some embodiments, the display panel further includes an alignment film disposed on a side, distal to the substrate, of the slit electrode and disposed on the side, proximal to the substrate, of the black matrix; wherein the alignment film is configured to provide initial alignment to liquid crystal in the display panel.

In some embodiments, each of the sub-pixels is divided into two domains, and an aperture area of the two domains of the sub-pixels is same.

Some embodiments of the present disclosure further provide a display device, including the above display panel.

BRIEF DESCRIPTION OF THE DRAWINGS

The drawings are provided to further understand the embodiments of the present disclosure and constitute a part of this specification that, together with the embodiments of the present disclosure, and serve to explain the present disclosure, but do not limit the present disclosure. The above and other features and advantages will become more apparent to those skilled in the art through the detailed description of the exemplary embodiments with reference to the drawings as follows.

DETAILED DESCRIPTION

To enable those skilled in the art to better understand the technical solutions of the embodiments of the present disclosure, a display panel and a display device according to the embodiments of the present disclosure are further described in detail below with reference to the drawings and specific embodiments.

Embodiments of the present disclosure will be described more fully below with reference to the drawings, but the embodiments shown may be embodied in different forms and should not be construed as being limited to the embodiments set forth herein. Rather, these embodiments are provided to make the present disclosure thorough and complete and enable those skilled in the art to fully understand the scope of the present disclosure.

Embodiments of the present disclosure are not limited to the embodiments shown in the drawings, but include modifications of configurations formed based on manufacturing processes. Accordingly, the regions illustrated in the drawings are for illustrative purposes, and the shapes of the regions shown in the drawings illustrate specific shapes of the regions, but are not intended to be limiting.

For liquid crystal display products that do not require high transmittance, to reduce the brightness of the gray level 0 (L0) and improve contrast, the black matrix is widened to shield areas where light leakage occurs. This solution effectively prevent the gray level 0 light leakage, such that the contrast of liquid crystal display products is improved. However, for products with high transmittance, for achieving a high aperture ratio, the width of the black matrix is only 5.5 μm, which is not wide enough to shield the light leakage area in a case of limited ability to manage and control the liquid crystal cell alignment process, so the defect of the gray level 0 light leakage occurs frequently.

Figure 1:
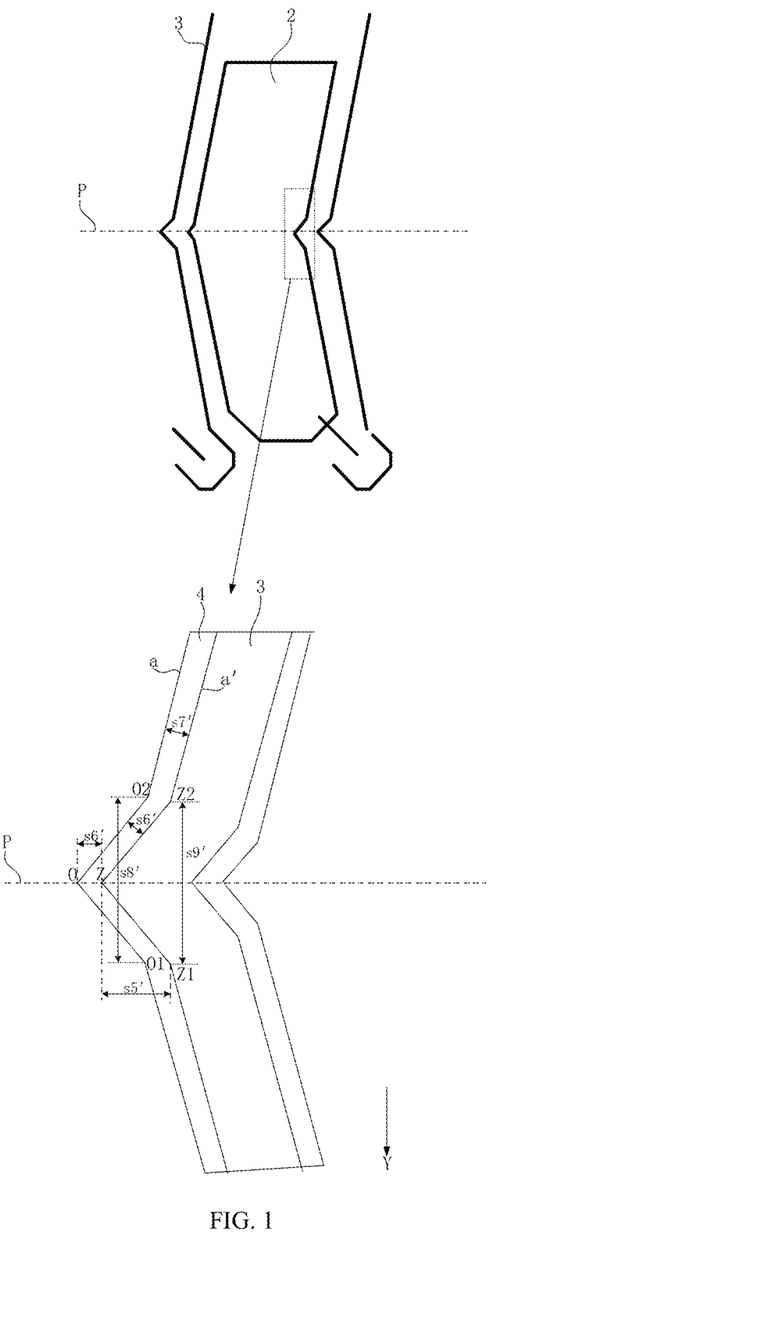
FIG. 1 is a top view of a sub-pixel in a liquid crystal display product according to a convention structure.

Referring to FIG. 1, it is a top view of a sub-pixel in a liquid crystal display product according to a convention structure. In the figure, for enhancing the visual display effect of the high-transmittance portable liquid crystal display product, a domain-specific design approach is employed for its sub-pixel 2, such as dividing a sub-pixel 2 into two domains along the column direction Y of the sub-pixel array, and the data line 3 disposed between adjacent columns of the sub-pixels 2 is designed to be raised away from the column direction Y of the sub-pixel array at the domain boundary position P to form a corner. Accordingly, the black matrix 4 covering the data line 3 is designed the same way as the data line 3 at the domain boundary position P with a raised corner.

Figure 2:
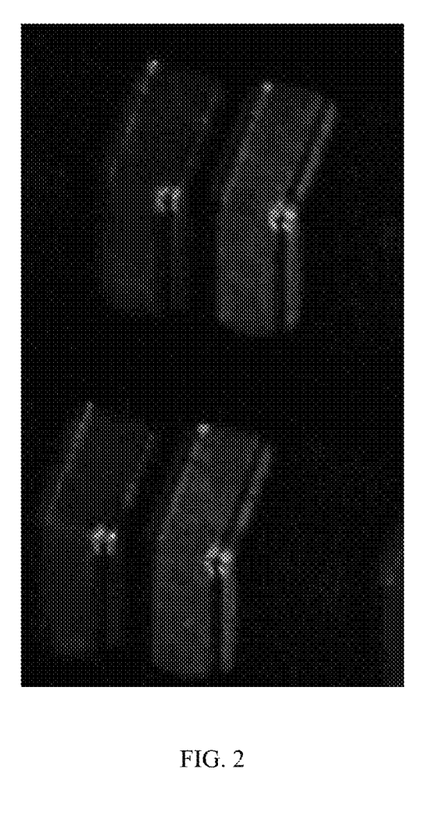
FIG. 2 is a schematic diagram illustrating the defect of light leakage at a raised corner of a data line in the liquid crystal display product of FIG. 1.

Referring to FIG. 1, the corner of the data line 3 at the domain boundary position P is raised to a great degree, for example, at the outer edge a' of the raised corner of the data line 3, the distance s5' between the straight line, where the vertex Z of the raised corner is located, along the column direction Y of the sub-pixel array and the straight line, where the bending point forming the raised corner is located, along the column direction Y of the sub-pixel array is about 2 to 4 μm. The raised corner of the data line 3 at the domain boundary position P results in a significant metal transition difference in the area of the liquid crystal display product, such as the array substrate provided with the data line, which leads to abnormal alignment at the large metal transition difference of the liquid crystal alignment film prepared in the subsequent process, causing light leakage at the raised corner of the data line, as shown in FIG. 2, which is a schematic diagram illustrating the defect of light leakage at a raised corner of a data line in the liquid crystal display product of FIG. 1. In addition, the distance s6' between the vertex O of the raised corner of the black matrix 4 and the vertex Z of the raised corner of the data line 3 ranges from 1 to 2 µm; the distance s6' between the outer edge a of the black matrix 4 covering the raised corner of the data line 3 and the outer edge a' of the raised corner of the data line 3 ranges from 1 to 2 µm; the distance s7' between the edge of the black matrix 4 covering the rest of the data line 3 and the corresponding edge of the data line 3 covered by the black matrix ranges from 1 to 2 µm; at the outer edge a of the raised corner of the black matrix 4, the first bending start point O1 and the first bending end point O2 forming the raised corner of the black matrix 4 are disposed on the same straight line along the column direction Y of the array; at the outer edge a' of the raised corner of the data line 3, the second bending start point Z1 and the second bending end point Z2 forming the raised corner of the data line 3 are disposed on the same straight line along the column direction Y of the array; and the difference between the distance s8' between the first bending start point O1 and the first bending end point O2 and the distance s9' between the second bending start point Z1 and the second bending end point Z2 ranges from 1 to 2 µm.

The problem of light leakage at the raised corner of the data line will directly lead to excessive brightness at the gray level 0 (L0) of the liquid crystal display product, significantly reducing the contrast of the display product. The solution for the problem of reduced contrast in the convention structure is to increase the overall width of the black matrix to increase its coverage of the data line, ensuring that the black matrix can fully shield the light leakage area of the raised corner of the data line. However, the method is at the cost of reducing the aperture ratio of most of the sub-pixels, which can no longer meet the market demand for an increasingly higher transmittance of the display product, so there is an urgent need to further optimize the design of the display product to avoid the light leakage problem at the raised corner of the data line while ensuring the aperture ratio of the sub-pixel.

Figure 3:
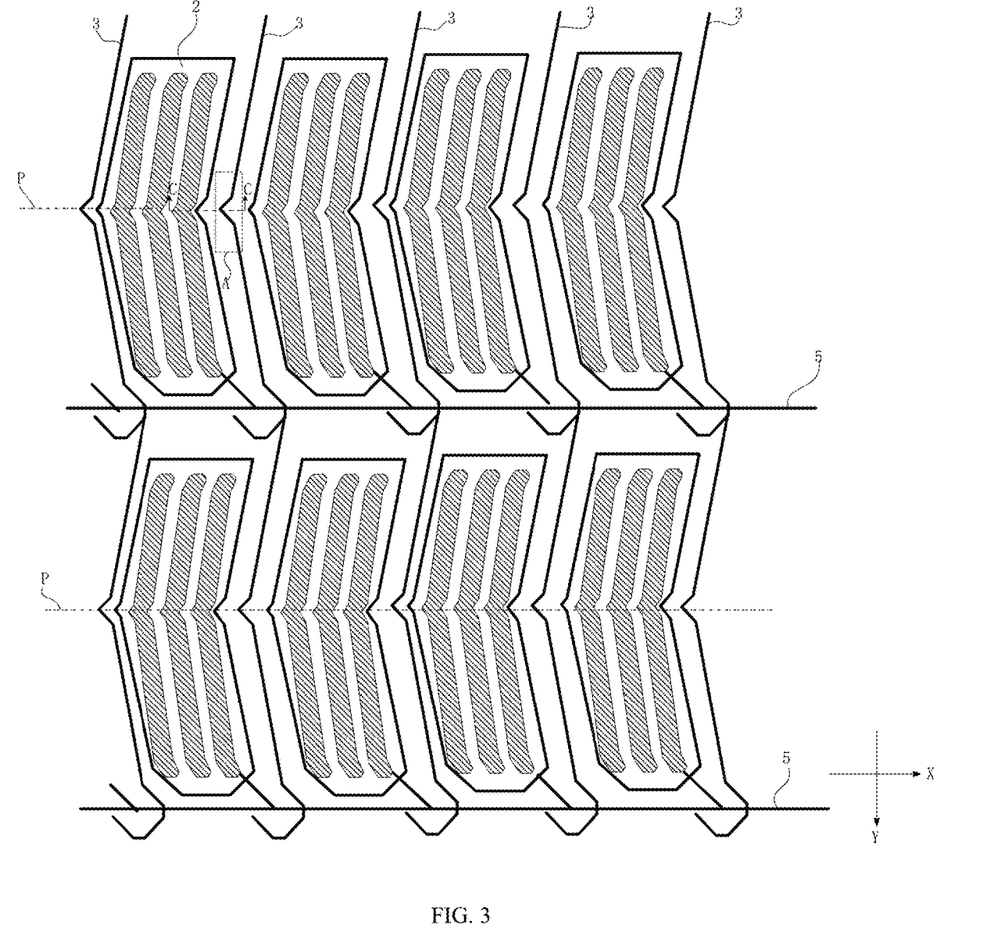
FIG. 3 is a schematic structural diagram of sub-pixels in a display panel according to some embodiments of the present disclosure.
Figure 4:
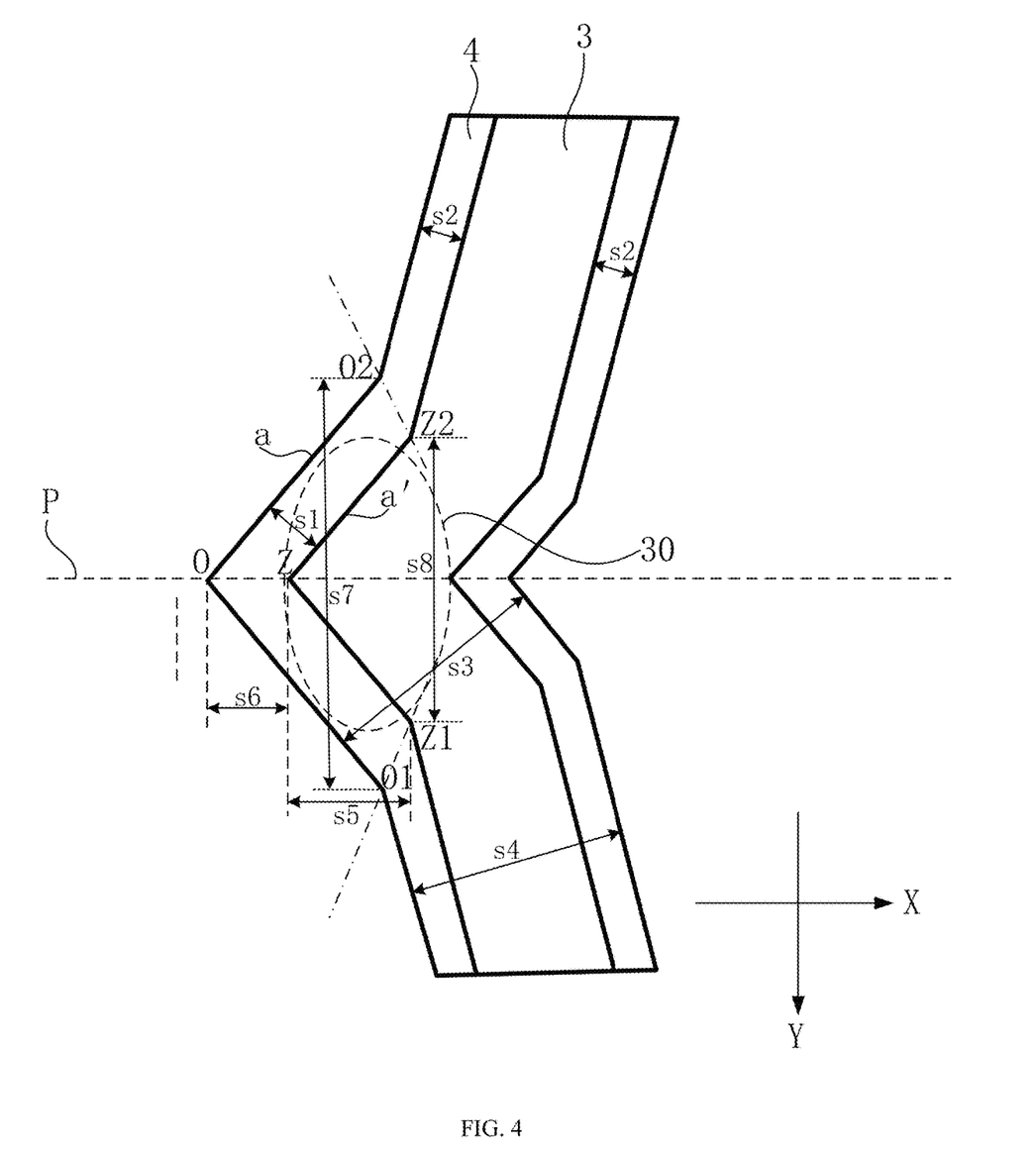
FIG. 4 is an enlarged schematic view of portion A in FIG. 3.

As for how to avoid light leakage at the raised corner of the data line while ensuring the aperture ratio of the sub-pixel in the liquid crystal display product, the embodiments of the present disclosure provide a display panel, as shown in FIGS. 3 and 4. FIG. 3 is a schematic structural diagram of sub-pixels in a display panel according to some embodiments of the present disclosure; and FIG. 4 is an enlarged schematic view of portion A in FIG. 3. In the figures, the display panel includes a substrate; a plurality of sub-pixels 2 disposed in an array on the substrate; a plurality of data lines 3 disposed on the substrate; and a black matrix 4 disposed on a side, distal to the substrate, of the data lines 3 with an orthographic projection of the black matrix 4 onto the substrate covering the data lines 3; wherein the plurality of data lines 3 and a plurality of columns of the sub-pixels 2 are alternately arranged in sequence along a row direction X of the array, each data line 3 is connected correspondingly to one column of the sub-pixels 2 corresponding to the data line; each of the sub-pixels 2 is divided into at least two domains along a column direction Y of the array; and at a domain boundary position P of two adjacent domains, the data line 3 deviates from the column direction Y of the array and bends toward the row direction X of the array to form a corner 30, wherein the distance s1 between an outer edge a of the orthographic projection of the black matrix 4 covering the corner 30 onto the substrate and an outer edge a' of the orthographic projection of the corner 30 onto the substrate is greater than the distance s2 between the edge of the orthographic projection of the black matrix 4 covering the rest of the data line 3 onto the substrate and the corresponding edge of the orthographic projection of the data line 3 covered by the black matrix onto the substrate; and the outer edge corresponds to the edge where a raised side of the corner 30 is located.

The data line 3 has a uniform line width. For example, the line width of the data line 3 ranges from 3 to 5 µm. By making the distance s1 between the outer edge a of the orthographic projection of the black matrix 4 covering the corner 30 onto the substrate and the outer edge a' of the orthographic projection of the corner 30 onto the substrate greater than the distance s2 between the edge of the orthographic projection of the black matrix 4 covering the rest of the data line 3 onto the substrate and the corresponding edge of the orthographic projection of the data line 3 covered by the black matrix onto the substrate, on the one hand, the full shielding of the black matrix 4 to the outer edge a' of the orthographic projection of the corner 30 of the data line 3 onto the substrate can be achieved, such that the defect of light leakage at the corner 30 resulted from the subsequent abnormal alignment of the alignment film caused by the transition difference at the corner 30 of the data line 3 is avoided; and on the other hand, the full shielding of the black matrix 4 to the rest of the data line 3 beyond the corner 30 can be achieved. At the same time, there is no need to increase the width of the black matrix 4 covering the rest of the data line 3 beyond the corner 30 on the basis of the convention structure, for example, the width of the black matrix 4 covering the rest of the data line 3 beyond the corner 30 can still maintain the current smaller width of 5.5 µm for achieving a high aperture ratio. As a result, the light leakage occurring at the corner 30 of the data line 3 is avoided while ensuring the aperture ratio of the sub-pixel 2, thereby improving the contrast and transmittance of the display panel, and then improving the display effect of the display panel.

In some embodiments, the display panel further includes a plurality of scan lines 5, each of the plurality of scan lines 5 extends along the row direction X of the array, and each of the plurality of scan lines 5 is disposed correspondingly between two adjacent rows of sub-pixels 2; each of the scan lines 5 is connected to a row of sub-pixels 2 to provide scanning signals to the connected row of sub-pixels 2; the plurality of scan lines 5 spatially intersect with a plurality of data lines 3; and each of the data lines 3 is configured to provide data-driven signals for a column of sub-pixels 2 connected thereto, such that the progressive scan display of the sub-pixels 2 in the display panel is achieved.

In the embodiments, dividing domains for the sub-pixels 2 is beneficial to enhance the visual effect of the display panel displayed over a wider viewing angle.

In some embodiments, the width s3 of the orthographic projection of the black matrix 4 covering the corner 30 onto the substrate is greater than or equal to the width s4 of the orthographic projection of the black matrix 4 covering the rest of the data line 3 onto the substrate. That is, in the embodiments, for achieving the full shielding of the black matrix 4 to the outer edge a' of the orthographic projection of the corner 30 of the data line 3 onto the substrate, on the one hand, the width of the portion covering the corner 30 of the black matrix 4 is increased, that is, the width of a portion of the black matrix 4 is increased; on the other hand, the position of the portion covering the corner 30 of the black matrix 4 is adjusted with respect to the corner 30 without increasing the width of the portion of the black matrix 4. As a result, it is achieved that the distance s1 between the outer edge a of the orthographic projection of the black matrix 4 covering the corner 30 onto the substrate and the outer edge a' of the orthographic projection of the corner 30 onto the substrate is greater than the distance s2 between the edge of the orthographic projection of the black matrix 4 covering the rest of the data line 3 onto the substrate and the corresponding edge of the orthographic projection of the data line 3 covered by the black matrix onto the substrate, thereby achieving the full shielding of the black matrix 4 to the outer edge a' of the orthographic projection of the corner 30 of the data line 3 onto the substrate, and achieving the full shielding of the black matrix 4 to the rest of the data line 3 beyond the corner 30. Ultimately, the light leakage occurring at the corner 30 of the data line 3 is avoided while ensuring the aperture ratio of the sub-pixel 2, thereby improving the contrast and transmittance of the display panel.

In some embodiments, at the outer edge a' of the orthographic projection of the corner 30 onto the substrate, the distance s5 between the straight line, where the vertex Z of the corner 30 is located, along the column direction Y of the array and the straight line, where the bending point forming the corner 30 is located, along the column direction Y of the array ranges from 1 to 3 μm.

In the embodiments, the shape of the corner 30 of the data line 3 is a triangle, and on the outer edge a' of the orthographic projection of the corner 30 of the data line 3 onto the substrate, the second bending start point Z1 and the second bending end point Z2 forming the corner 30 of the data line 3 are disposed on the same straight line along the column direction Y of the array; the above straight line, where the bending points forming the corner 30 are located, along the column direction Y of the array is the straight line where the second bending start point Z1 and the second bending end point Z2 are located. In some embodiments, in the case that the second bending start point Z1 and the second bending end point Z2 are not on the same straight line, the above straight line, where the bending points forming the corner 30 are located, along the column direction Y of the array is determined by the straight line along the column direction Y of the array where the second bending start point Z1 or the second bending end point Z2 is located that is farther from the straight line along the column direction Y of the array where the vertex Z of the corner 30 is located. This is because the transition difference at the corner 30 of the data line 3 is determined by the distance between the straight line, where the vertex Z of the corner 30 is located, along the column direction Y of the array and the straight line, where the bending point forming the corner 30 that is farther from the vertex Z of the corner 30 are located, along the column direction Y of the array.

Compared with the case in the convention structure where at the outer edge of the raised corner of the data line, the distance s5' between the straight line, where the vertex of the raised corner is located, along the column direction of the sub-pixel array and the straight line, where the bending point forming the raised corner is located, along the column direction of the sub-pixel array is about 2 to 4 μm. In the embodiments, at the outer edge a' of the orthographic projection of the corner 30 onto the substrate, the distance s5 between the straight line, where the vertex Z of the corner 30 is located, along the column direction Y of the array and the straight line, where the bending point forming the corner 30 is located, along the column direction Y of the array is significantly shortened, that is, the transition difference at the corner 30 of the data line 3 is significantly shortened, such that the width of the portion covering the corner 30 of the black matrix 4 is relatively increased. At the same time, the distance s1 between the outer edge a of the orthographic projection of the black matrix 4 covering the corner 30 onto the substrate and the outer edge a' of the orthographic projection of the corner 30 onto the substrate is relatively increased without altering the width and position of the black matrix 4 covering the corner 30 with respect to that in the convention structure. As a result, the full shielding of the black matrix 4 to the outer edge a' of the orthographic projection of the corner 30 of the data line 3 onto the substrate is achieved, such that the defect of light leakage at the corner 30 resulted from the subsequent abnormal alignment of the alignment film caused by the transition difference at the corner 30 of the data line 3 is avoided.

In some embodiments, the black matrix 4 covering the corner 30 forms the same shape as the corner 30; the vertex O of the corner of the black matrix 4 and the vertex Z of the corner of the data line 3 are disposed on the same straight line along the row direction X of the array; the distance s6 between the vertex O of the corner of the black matrix 4 and the vertex Z of the corner of the data line 3 ranges from 2 to 4 μm.

Compared with the case in the convention structure where the distance s6' between the vertex O of the raised corner of the black matrix 4 and the vertex Z of the raised corner of the data line 3 ranges from 1 to 2 μm, in the embodiments, the distance s6 between the vertex O of the corner of the black matrix 4 and the vertex Z of the corner of the data line 3 is significantly increased, that is, on the basis that the transition difference at the corner 30 of the data line 3 is significantly shortened, the width of the portion covering the corner 30 of the black matrix 4 in the embodiments is increased, such that the full shielding of the black matrix 4 to the outer edge a' of the orthographic projection of the corner 30 of the data line 3 onto the substrate can be further achieved, thereby further avoiding the defect of light leakage at the corner 30 resulted from the subsequent abnormal alignment of the alignment film caused by the transition difference at the corner 30 of the data line 3.

In some embodiments, the outer edge a of the orthographic projection of the black matrix 4 covering the corner 30 onto the substrate is parallel to the outer edge a' of the orthographic projection of the corner 30 onto the substrate; and the distance s1 between the outer edge a of the orthographic projection of the black matrix 4 covering the corner 30 onto the substrate and the outer edge a' of the orthographic projection of the corner 30 onto the substrate ranges from 2 to 4 μm.

Compared with the case in the convention structure where the distance s6' between the outer edge a of the orthographic projection of the black matrix 4 covering the raised corner of the data line 3 onto the substrate and the outer edge a' of the orthographic projection of the raised corner of the data line 3 onto the substrate ranges from 1 to 2 μm, in the embodiments, the distance s1 between the outer edge a of the orthographic projection of the black matrix 4 covering the corner 30 onto the substrate and the outer edge a' of the orthographic projection of the corner 30 onto the substrate is significantly increased, that is, on the basis that the transition difference at the corner 30 of the data line 3 is significantly shortened, the width of the portion covering the corner 30 of the black matrix 4 in the embodiments is increased, such that the full shielding of the black matrix 4 to the outer edge a' of the orthographic projection of the corner 30 of the data line 3 onto the substrate can be further achieved, thereby further avoiding the defect of light leakage at the corner 30 resulted from the subsequent abnormal alignment of the alignment film caused by the transition difference at the corner 30 of the data line 3.

In some embodiments, the outer edge a of the orthographic projection of the black matrix 4 covering the corner 30 onto the substrate is not parallel to the outer edge a' of the orthographic projection of the corner 30 onto the substrate; and the distance between the outer edge a of the orthographic projection of the black matrix 4 covering the corner 30 onto the substrate and the outer edge a' of the orthographic projection of the corner 30 onto the substrate varies at different positions.

In some embodiments, the distance s2 between the edge of the orthographic projection of the black matrix 4 covering the rest of the data line 3 onto the substrate and the corresponding edge of the orthographic projection of the data line 3 covered by the black matrix onto the substrate ranges from 1 to 2 µm.

Compared with the case in the convention structure where the distance s7' between the edge of the orthographic projection of the black matrix 4 covering the rest of the data line 3 onto the substrate and the corresponding edge of the orthographic projection of the data line 3 covered by the black matrix onto the substrate ranges from 1 to 2 µm, in the embodiments, the distance s2 between the edge of the orthographic projection of the black matrix 4 covering the rest of the data line 3 onto the substrate and the corresponding edge of the orthographic projection of the data line 3 covered by the black matrix onto the substrate remains unchanged, such that the full shielding of the black matrix 4 to the rest of the data line 3 beyond the corner 30 without altering the width of the black matrix 4 covering the rest of the data line 3 beyond the corner 30 can be achieved, and the width of the black matrix 4 covering the rest of the data line 3 beyond the corner 30 can still maintain a smaller width, such as 5.5 µm, for achieving a high aperture ratio. Ultimately, it is ensured that there will not be a great change in the aperture ratio of the sub-pixel 2, thus improving the transmittance of the display panel, and then improving the display effect of the display panel.

In some embodiments, the shapes of the corner of the black matrix 4 and the corner of data line 3 are both triangular; at the outer edge a of the orthographic projection of the corner of the black matrix 4 onto the substrate, the first bending start point O1 and the first bending end point O2 forming the corner of the black matrix 4 are disposed on the same straight line along the column direction Y of the array; at the outer edge a' of the orthographic projection of the corner 30 of the data line 3 onto the substrate, the second bending start point Z1 and the second bending end point Z2 forming the corner 30 of the data line 3 are disposed on the same straight line along the column direction Y of the array; and the difference between the distance s7 between the first bending start point O1 and the first bending end point O2 and the distance s8 between the second bending start point Z1 and the second bending end point Z2 ranges from 3 to 5 µm.

Compared with the case in the convention structure where the difference between the distance s8' between the first bending start point O1 and the first bending end point O2 and the distance s9' between the second bending start point Z1 and the second bending end point Z2 ranges from 1 to 2 µm, in the embodiments, the difference between the distance s7 between the first bending start point O1 and the first bending end point O2 and the distance s8 between the second bending start point Z1 and the second bending end point Z2 is significantly increased, which shortens the transition difference at the corner 30 of the data line 3 and at the same time increases the width of the portion covering the corner 30 of the black matrix 4. As a result, the liquid crystal disorder area caused by the transition difference of the corner 30 of the data line 3 at the domain boundary position P is reduced, and at the same time, the area of the black matrix 4 wrapping the corner 30 of the data line 3 is increased, effectively reducing the light leakage area at the corner 30 of the data line 3.

Figure 5:
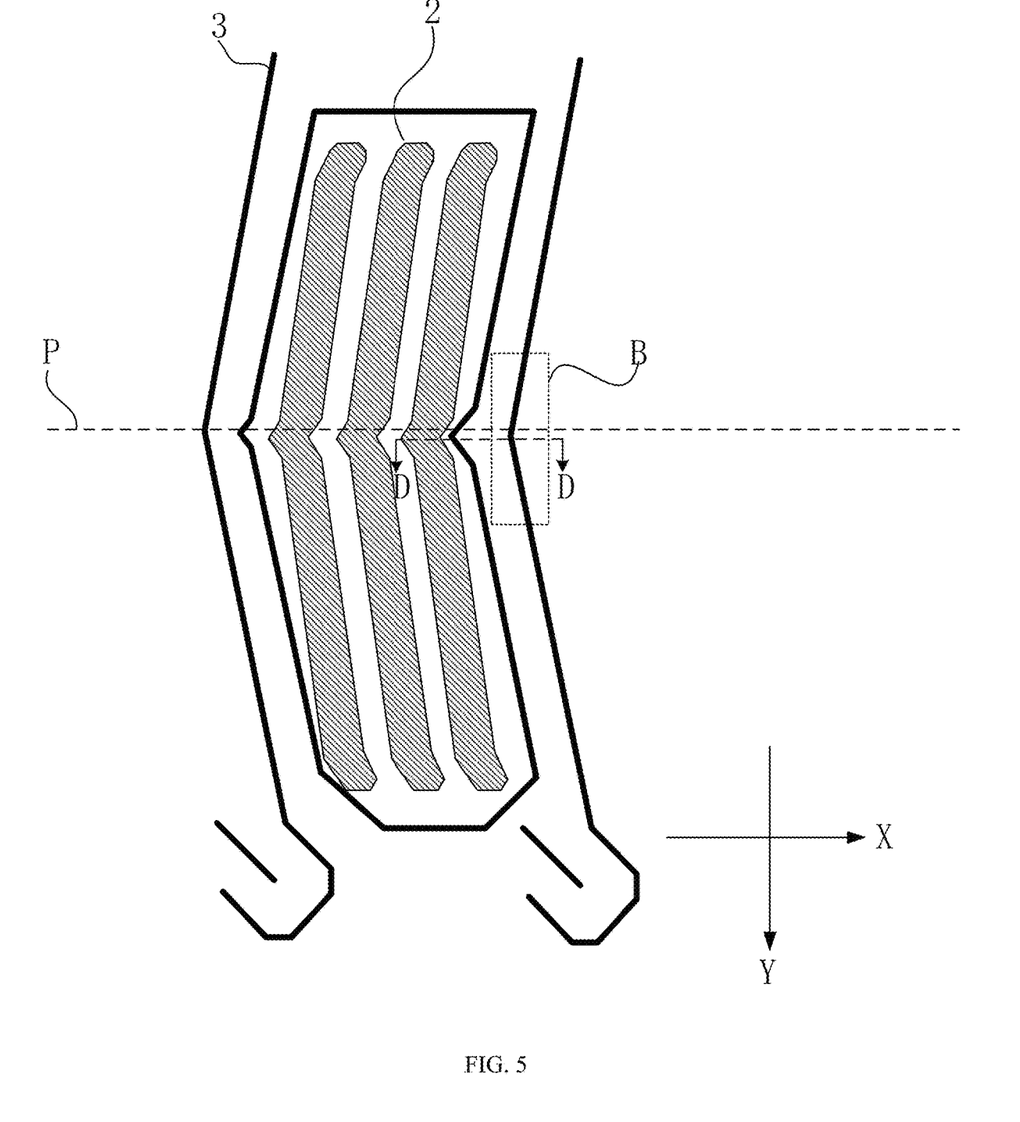
FIG. 5 is a schematic diagram of a sub-pixel in another display panel according to some embodiments of the present disclosure.
Figure 6:
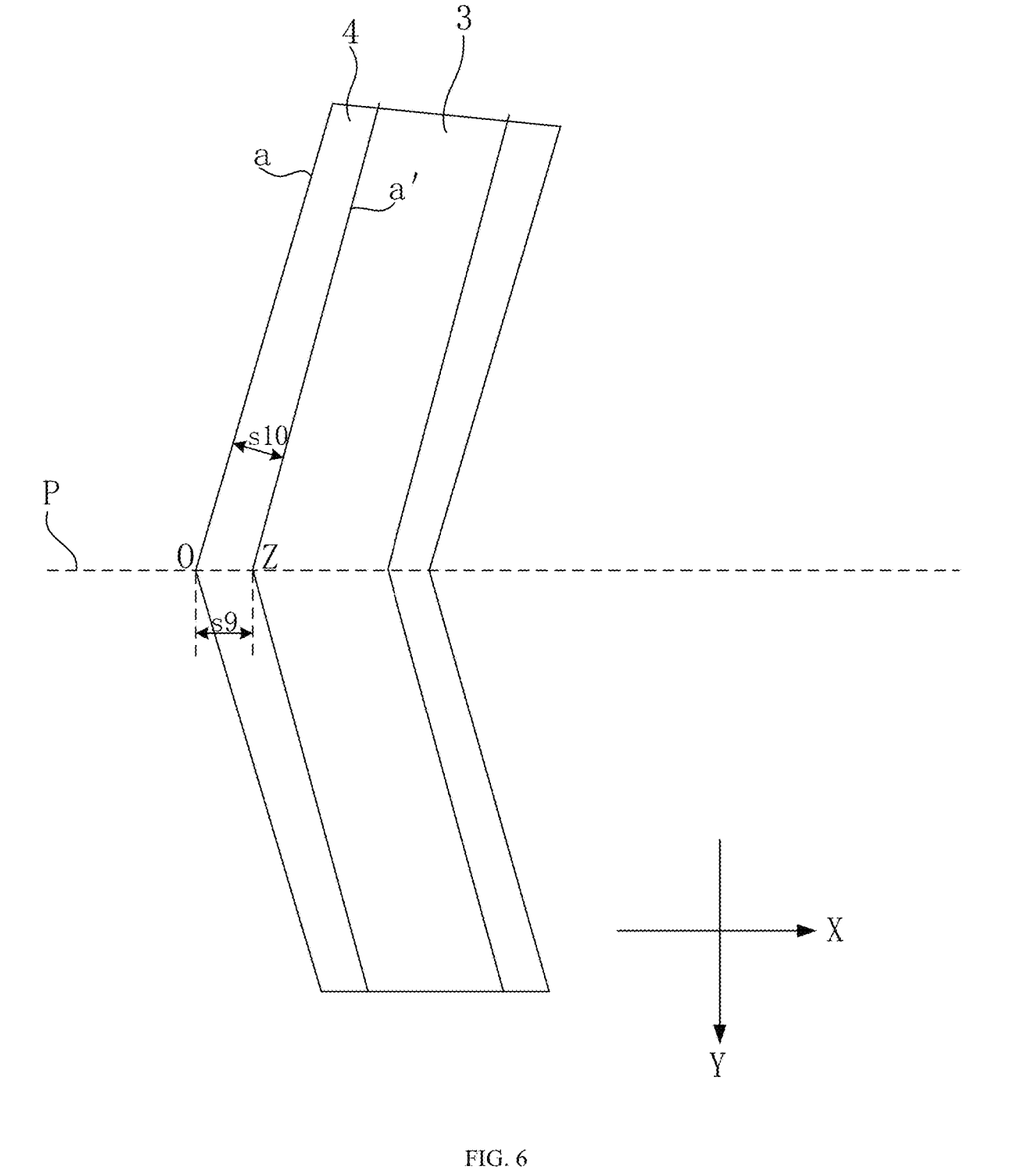
FIG. 6 is an enlarged schematic view of portion B in FIG. 5.

In some embodiments, referring to FIGS. 5 and 6, FIG. 5 is a schematic diagram of a sub-pixel in another display panel according to some embodiments of the present disclosure. FIG. 6 is an enlarged schematic view of portion B in FIG. 5. In the figure, at the outer edge a' of the orthographic projection of the corner onto the substrate, the distance between the straight line, where the vertex Z of the corner is located, along the column direction Y of the array and the straight line, where the bending point forming the corner is located, along the column direction Y of the array is 0. In the embodiments, the corner of the data line 3 at the domain boundary position P is designed to form a smooth transition, that is, there is no corner formed between two adjacent domains, such that the transition difference of the data line 3 at the domain boundary position P is completely eliminated, thereby avoiding the defect of light leakage resulted from the subsequent abnormal alignment of the alignment film caused by the transition difference of the data line 3 at the domain boundary position P, thereby improving the contrast of the display panel.

In some embodiments, referring to FIG. 6, the data lines 3 corresponding to two adjacent domains of the sub-pixel 2 respectively deviate from the column direction Y of the array toward the domain boundary position P, and intersect at the domain boundary position P to form the vertex Z of the data line 3; the black matrix 4 covering the data line 3 has the same shape as the data line 3; the vertex O of the black matrix 4 and the vertex Z of the data line 3 are disposed on the same straight line along the row direction X of the array; and the distance s9 between the vertex O of the black matrix 4 and the vertex Z of the data line 3 ranges from 1 to 4 µm.

As there is no corner formed on the data line between two adjacent domains in the design shown in FIG. 6, completely eliminating the transition difference of the data line 3 at the domain boundary position P, a distance s9 (which corresponds to the distance s6' in FIG. 1 or the distance s6 in FIG. 4) of 1 to 4 µm is set between the vertex O of the black matrix 4 and the vertex Z of the data line 3, which avoid the defect of light leakage resulted from the subsequent abnormal alignment of the alignment film caused by the transition difference of the data line 3 at the domain boundary position P.

In some embodiments, referring to FIG. 6, the outer edge a of the orthographic projection of the black matrix 4 covering the data line 3 onto the substrate is parallel to the outer edge a' of the orthographic projection of the data line 3 onto the substrate; the distance s10 between the outer edge a of the orthographic projection of the black matrix 4 covering the data line 3 onto the substrate and the outer edge a' of the orthographic projection of the data line 3 onto the substrate ranges from 1 to 4 µm; and the outer edge corresponds to the edge where the vertex Z of the data line 3 is disposed.

As there is no corner formed on the data line between two adjacent domains in the design shown in FIG. 6, completely eliminating the transition difference of the data line 3 at the domain boundary position P, a distance s10 (which corresponds to the distance s6' in FIG. 1 or the distance s2 in FIG. 4) of 1 to 4 μm is set between the outer edge a of the orthographic projection of the black matrix 4 covering the data line 3 onto the substrate and the outer edge a' of the orthographic projection of the data line 3 onto the substrate, which avoid the defect of light leakage resulted from the subsequent abnormal alignment of the alignment film caused by the transition difference of the data line 3 at the domain boundary position P.

In some embodiments, the portion of the data line 3 corresponding to two adjacent domains of the sub-pixel 2 except the domain boundary position P deviates from the column direction Y of the array toward the domain boundary position P. This is beneficial to enhance the visual effect of the display panel displayed over a wider viewing angle.

Figure 7:
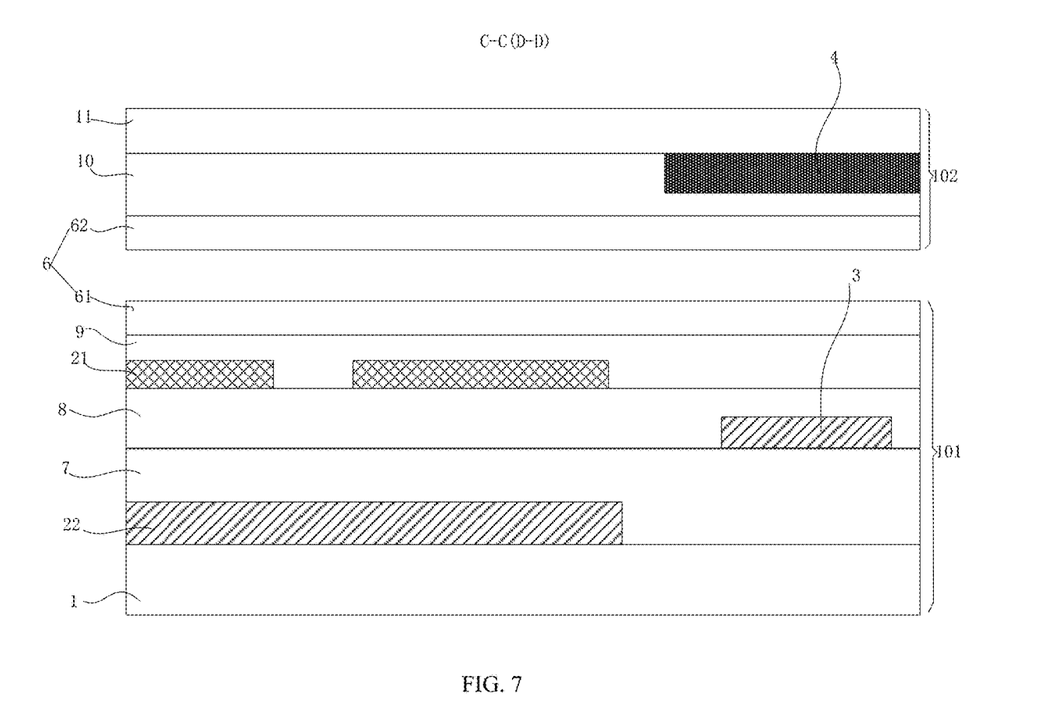
FIG. 7 is a sectional view of the structure along the CC section line in FIG. 3 and along the DD section line in FIG. 5.

In some embodiments, referring to FIG. 7, FIG. 7 is a sectional view of the structure along the CC section line in FIG. 3 and along the DD section line in FIG. 5. In the figure, the sub-pixel 2 includes a pixel electrode 21 and a common electrode 22, one of the pixel electrode 21 and the common electrode 22 is disposed on a side, proximal to the substrate 1, of the data line 3, and the other is disposed on a side, distal to the substrate 1, of the data line 3 and disposed on a side, proximal to the substrate 1, of the black matrix 4; the orthographic projection of the pixel electrode 21 onto the substrate 1 is overlapped with the orthographic projection of the common electrode 22 onto the substrate 1; one of the pixel electrode 21 and the common electrode 22, which disposed on the side, distal to the substrate 1, of the data line 3 is a slit electrode; and the shape of the slit in the slit electrode is the same as the shape of the data line 3 with the corner 30 corresponding to the sub-pixel 2.

In the embodiments, the common electrode 22 is disposed on the side, proximal to the substrate 1, of the data line 3, the pixel electrode 21 is disposed on the side, distal to the substrate 1, of the data line 3, and the pixel electrode 21 is a slit electrode. That is, the display panel in the embodiments is of ADS type (Advanced Super Dimension Switch). By setting the shape of the slit in the slit electrode to be the same as the shape of the data line 3 with the corner 30 corresponding to the sub-pixel 2, the shape of the slit electrode matches that of the data line 3 with the corner 30 to avoid displaying defects (i.e., displaying MURA) when the display panel is pressed or touched, and at the same time enhance the visual effect of the display panel displayed over a wider viewing angle.

In some embodiments, referring to FIG. 7, the display panel further includes an alignment film 6 which is disposed on a side, distal to the substrate 1, of the slit electrode and disposed on a side, proximal to the substrate 1, of the black matrix 4; and the alignment film is configured to provide initial alignment to the liquid crystal in the display panel.

The alignment film 6 includes a first alignment film 61 and a second alignment film 62. The display panel includes an array substrate 101 and a cell alignment substrate 102, wherein the array substrate 101 includes a substrate 1, a common electrode 22, an insulation layer 7, a data line 3, a first planarization layer 8, a pixel electrode 21, a second planarization layer 9, and a first alignment film 61 sequentially arranged from bottom to top; and the cell alignment substrate 102 includes a second alignment film 62, a third planarization layer 10, a black matrix 4, and a second substrate 11 sequentially arranged from bottom (i.e., the array substrate 101) to top. The liquid crystal (not shown in the figure) is disposed in the gap formed by the array substrate 101 and the cell alignment substrate 102.

In some embodiments, referring to FIGS. 3 and 5, each of the sub-pixels 2 is divided into two domains, and the aperture area of the two domains of the sub-pixel 2 is the same. This further enhances the visual effect of the display panel displayed over a wider viewing angle.

As for the display panel according to the embodiments of the present disclosure, By making the distance s1 between the outer edge a of the orthographic projection of the black matrix 4 covering the corner 30 onto the substrate and the outer edge a' of the orthographic projection of the corner 30 onto the substrate greater than the distance s2 between the edge of the orthographic projection of the black matrix 4 covering the rest of the data line 3 onto the substrate and the corresponding edge of the orthographic projection of the data line 3 covered by the black matrix onto the substrate, on the one hand, the full shielding of the black matrix 4 to the outer edge a' of the orthographic projection of the corner 30 of the data line 3 onto the substrate can be achieved, such that the defect of light leakage at the corner 30 resulted from the subsequent abnormal alignment of the alignment film caused by the transition difference at the corner 30 of the data line 3 is avoided; and on the other hand, the full shielding of the black matrix 4 to the rest of the data line 3 beyond the corner 30 can be achieved. At the same time, there is no need to increase the width of the black matrix 4 covering the rest of the data line 3 beyond the corner 30 on the basis of the convention structure, for example, the width of the black matrix 4 covering the rest of the data line 3 beyond the corner 30 can still maintain the current smaller width of 5.5 μm for achieving a high aperture ratio. As a result, the light leakage occurring at the corner 30 of the data line 3 is avoided while ensuring the aperture ratio of the sub-pixel 2, thereby improving the contrast and transmittance of the display panel, and then improving the display effect of the display panel.

The embodiments of the present disclosure further provide a display device, including the display panel in the above embodiments.

By adopting the display panel according to the above embodiments, the defect of light leakage of the display device is avoided, such that the contrast and transmittance of the display device are improved, and then the display effect of the display device is improved.

The display device may be any product or component with a display function, such as an LCD panel, an LCD TV, a mobile phone, a tablet computer, a notebook computer, a display, a notebook computer, a digital photo frame, and a navigator.

It is to be understood that the above embodiments are merely exemplary embodiments for the purpose of illustrating the principles of the present disclosure, and the present disclosure is not limited thereto. For those of ordinary skill in the art, various modifications and improvements can be made without departing from the intention and substance of the present disclosure, and these modifications and improvements are also considered to be within the scope of protection of the present disclosure.

What is claimed is:
1. A display panel, comprising a substrate,
a plurality of sub-pixels disposed in an array on the substrate;
a plurality of data lines disposed on the substrate; and
a black matrix disposed on a side, distal to the substrate, of the data lines, wherein an orthographic projection of the black matrix onto the substrate covers the data lines; wherein the plurality of data lines and the plurality of columns of the sub-pixels are alternately arranged in sequence along a row direction of the array, and each data line is connected to one column of the sub-pixels corresponding to the data line;

each of the sub-pixels is divided into at least two domains along a column direction of the array; and at a domain boundary position of two adjacent domains, the data line deviates from the column direction of the array and bends toward the row direction of the array to form a corner, wherein a distance between an outer edge of an orthographic projection of the black matrix covering the corner onto the substrate and an outer edge of an orthographic projection of the corner onto the substrate is greater than a distance between an edge of an orthographic projection of the black matrix covering rest of the data line onto the substrate and a corresponding edge of an orthographic projection of the data line covered by the black matrix onto the substrate;

the outer edge corresponds to an edge where a raised side of the corner is located; and at the outer edge of the orthographic projection of the corner onto the substrate, a distance between a straight line, where a vertex of the corner is located, along the column direction of the array and a straight line, where a bending point forming the corner is located, along the column direction of the array ranges from 1 to 3 µm, such that a transition difference at the corner of the data line is significantly shortened, and a width of a portion covering the corner of the black matrix is relatively increased.

2. The display panel according to claim 1, wherein a width of the orthographic projection of the black matrix covering the corner onto the substrate is greater than or equal to a width of the orthographic projection of the black matrix covering the rest of the data line onto the substrate.

3. The display panel according to claim 1, wherein the black matrix covering the corner forms a same shape as the corner;

a vertex of a corner of the black matrix and a vertex of the corner of the data line are disposed on a same straight line along the row direction of the array; and a distance between the vertex of the corner of the black matrix and the vertex of the corner of the data line ranges from 2 to 4 µm.

4. The display panel according to claim 3, wherein the outer edge of the orthographic projection of the black matrix covering the corner onto the substrate is parallel to the outer edge of the orthographic projection of the corner onto the substrate; and the distance between the outer edge of the orthographic projection of the black matrix covering the corner onto the substrate and the outer edge of the orthographic projection of the corner onto the substrate ranges from 2 to 4 µm.

5. The display panel according to claim 4, wherein the distance between the edge of the orthographic projection of the black matrix covering the rest of the data line onto the substrate and the corresponding edge of the orthographic projection of the data line covered by the black matrix onto the substrate ranges from 1 to 2 µm.

6. The display panel according to claim 3, wherein a shape of the corner of the black matrix and a shape of the corner of the data line are both triangular;

at an outer edge of an orthographic projection of the corner of the black matrix onto the substrate, a first bending start point and a first bending end point forming the corner of the black matrix are disposed on a same straight line along the column direction of the array;

at an outer edge of an orthographic projection of the corner of the data line onto the substrate, a second bending start point and a second bending end point forming the corner of the data line are disposed on a same straight line along the column direction of the array; and a difference between a distance between the first bending start point and the first bending end point and a distance between the second bending start point and the second bending end point ranges from 3 to 5 µm.

7. The display panel according to claim 1, wherein at the outer edge of the orthographic projection of the corner onto the substrate, a distance between a straight line, where a vertex of the corner is located, along the column direction of the array and a straight line, where a bending point forming the corner is located, along the column direction of the array is 0.

8. The display panel according to claim 7, wherein the data lines corresponding to two adjacent domains of the sub-pixels respectively deviate from the column direction of the array toward the domain boundary position, and intersect at the domain boundary position to form a vertex of the data line;

the black matrix covering the data line has a same shape as the data line;

a vertex of the black matrix and the vertex of the data line are disposed on a same straight line along the row direction of the array; and a distance between the vertex of the black matrix and the vertex of the data line ranges from 1 to 4 µm.

9. The display panel according to claim 8, wherein an outer edge of an orthographic projection of the black matrix covering the data line onto the substrate is parallel to an outer edge of an orthographic projection of the data line onto the substrate;

a distance between the outer edge of the orthographic projection of the black matrix covering the data line onto the substrate and the outer edge of the orthographic projection of the data line onto the substrate ranges from 1 to 4 µm; and the outer edge corresponds to an edge where the vertex of the data line is located.

10. The display panel according to claim 1, wherein portions, except the domain boundary position, of the data lines corresponding to two adjacent domains of the sub-pixels deviate from the column direction of the array toward the domain boundary position.

11. The display panel according to claim 10, wherein the sub-pixel comprises a pixel electrode and a common electrode, one of the pixel electrode and the common electrode is disposed on a side, proximal to the substrate, of the data line, and another is disposed on a side, distal to the substrate, of the data line and disposed on a side, proximal to the substrate, of the black matrix;

an orthographic projection of the pixel electrode onto the substrate is overlapped with an orthographic projection of the common electrode onto the substrate;

one of the pixel electrode and the common electrode, which disposed on the side, distal to the substrate, of the data line is a slit electrode; and a shape of a slit in the slit electrode is same as a shape of the data line with the corner corresponding to the sub-pixel.

12. The display panel according to claim 11, further comprising an alignment film disposed on a side, distal to the substrate, of the slit electrode and disposed on the side, proximal to the substrate, of the black matrix; wherein the alignment film is configured to provide initial alignment to liquid crystal in the display panel.

13. The display panel according to claim 1, wherein each of the sub-pixels is divided into two domains, and an aperture area of the two domains of the sub-pixels is same.

14. A display device, comprising a display panel, wherein the display panel comprises a substrate,
- a plurality of sub-pixels disposed in an array on the substrate;
- a plurality of data lines disposed on the substrate; and
- a black matrix disposed on a side, distal to the substrate, of the data lines, wherein an orthographic projection of the black matrix onto the substrate covers the data lines; wherein
- the plurality of data lines and the plurality of sub-pixels are alternately arranged in sequence along a row direction of the array, and each data line is connected to one column of the sub-pixels corresponding to the data line;
- each of the sub-pixels is divided into at least two domains along a column direction of the array; and
- at a domain boundary position of two adjacent domains, the data line deviates from the column direction of the array and bends toward the row direction of the array to form a corner,
- wherein a distance between an outer edge of an orthographic projection of the black matrix covering the corner onto the substrate and an outer edge of an orthographic projection of the corner onto the substrate is greater than a distance between an edge of an orthographic projection of the black matrix covering rest of the data line onto the substrate and a corresponding edge of an orthographic projection of the data line covered by the black matrix onto the substrate;
- the outer edge corresponds to an edge where a raised side of the corner is located; and
- at the outer edge of the orthographic projection of the corner onto the substrate, a distance between a straight line, where a vertex of the corner is located, along the column direction of the array and a straight line, where a bending point forming the corner is located, along the column direction of the array ranges from 1 to 3 µm, such that a transition difference at the corner of the data line is significantly shortened, and a width of a portion covering the corner of the black matrix is relatively increased.

15. The display device according to claim 14, wherein a width of the orthographic projection of the black matrix covering the corner onto the substrate is greater than or equal to a width of the orthographic projection of the black matrix covering the rest of the data line onto the substrate.

16. The display device according to claim 14, wherein the black matrix covering the corner forms a same shape as the corner;
- a vertex of a corner of the black matrix and a vertex of the corner of the data line are disposed on a same straight line along the row direction of the array; and
- a distance between the vertex of the corner of the black matrix and the vertex of the corner of the data line ranges from 2 to 4 µm.

17. The display device according to claim 14, wherein at the outer edge of the orthographic projection of the corner onto the substrate, a distance between a straight line, where a vertex of the corner is located, along the column direction of the array and a straight line, where a bending point forming the corner is located, along the column direction of the array is 0.

18. The display device according to claim 17, wherein the data lines corresponding to two adjacent domains of the sub-pixels respectively deviate from the column direction of the array toward the domain boundary position, and intersect at the domain boundary position to form a vertex of the data line;
- the black matrix covering the data line has a same shape as the data line;
- a vertex of the black matrix and the vertex of the data line are disposed on a same straight line along the row direction of the array; and
- a distance between the vertex of the black matrix and the vertex of the data line ranges from 1 to 4 µm.

* * * * *